(12) United States Patent
Wang et al.

(10) Patent No.: US 9,206,828 B2
(45) Date of Patent: Dec. 8, 2015

(54) LOCKING MECHANISM FOR COMMUNICATION MODULE AND COMMUNICATION DEVICE

(71) Applicant: Huawei Technologies Co., Ltd., Shenzhen (CN)

(72) Inventors: Jianwei Wang, Shenzhen (CN); Zhifu Qiu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 472 days.

(21) Appl. No.: 13/779,074

(22) Filed: Feb. 27, 2013

(65) Prior Publication Data

US 2013/0170150 A1  Jul. 4, 2013

Related U.S. Application Data

(63) Continuation of application No. PCT/CN2011/073764, filed on May 6, 2011.

(30) Foreign Application Priority Data

Aug. 30, 2010  (CN) .......................... 2010 1 0270134

(51) Int. Cl.
*H05K 7/00* (2006.01)
*F16B 19/00* (2006.01)
(Continued)

(52) U.S. Cl.
CPC *F16B 19/00* (2013.01); *H05K 7/12* (2013.01); *H05K 7/1412* (2013.01); *Y10T 403/595* (2015.01)

(58) Field of Classification Search
USPC ............. 361/679.37–679.38, 679.57–679.58, 361/732, 754–759, 796–802; 312/223.1–223.2
See application file for complete search history.

(56) References Cited

U.S. PATENT DOCUMENTS 4,053,177 A * 10/1977 Stammreich et al. ......... 292/113
(Continued)

FOREIGN PATENT DOCUMENTS

| CN | 1305690 A | 7/2001 |
|---|---|---|
| CN | 2710110 Y | 7/2005 |

(Continued)

OTHER PUBLICATIONS

Chinese Patent No. 101965114, issued on Jul. 4, 2012, granted in corresponding Chinese Patent Application No. 201010270134.7.
(Continued)

*Primary Examiner* — Tuan T Dinh
(74) *Attorney, Agent, or Firm* — Brinks Gilson & Lione

(57) ABSTRACT

A locking mechanism for a communication module is provided. The locking mechanism includes a handle, a upper-and-lower bolt, a handle stopping mechanism, a handle self-locking mechanism, and a module frame on which those components are arranged; wherein the handle is connected with the upper-and-lower bolt through the linkage mechanism of the upper-and-lower bolt; when rotating under the action of a force, the handle is moved with the upper-and-lower bolt through the linkage mechanism, and the communication module is inserted into or pulled out of communication device by the elastic function of the upper-and-lower bolt; when the communication module is not inserted into the communication equipment, a stopping bolt on the handle stopping mechanism stops the handle and the handle is locked; when the communication module is inserted, the stopping bolt separates from and releases the handle and the handle is self-locked. The locking mechanism avoids mounting by screws.

8 Claims, 14 Drawing Sheets

(51) Int. Cl.
*H05K 7/14* (2006.01)
*H05K 7/12* (2006.01)

(56) References Cited

U.S. PATENT DOCUMENTS

| | | |
|---|---|---|
| 6,695,520 B1 | 2/2004 | Sarno et al. |
| 7,035,096 B2 | 4/2006 | Franz et al. |
| 8,749,966 B1 * | 6/2014 | Boudreau et al. ........ 361/679.33 |
| 2009/0059507 A1 * | 3/2009 | Peng et al. .................... 361/685 |

FOREIGN PATENT DOCUMENTS

| | | |
|---|---|---|
| CN | 201345455 Y | 11/2009 |
| CN | 101965114 A | 2/2011 |

OTHER PUBLICATIONS

International Search Report issued in corresponding PCT Patent Application No. PCT/CN2011/073764, mailed Aug. 18, 2011.
Written Opinion of the International Searching Authority issued in corresponding PCT Patent Application No. PCT/CN2011/073764, mailed Aug. 18, 2011.

* cited by examiner

LOCKING MECHANISM FOR COMMUNICATION MODULE AND COMMUNICATION DEVICE

CROSS-REFERENCE TO RELATED APPLICATIONS

This application is a continuation of International Application No. PCT/CN2011/073764, filed on May 6, 2011, which claims priority to Chinese Patent Application No. 201010270134.7, filed on Aug. 30, 2010, both of which are hereby incorporated by reference in their entireties.

FIELD OF THE INVENTION

The present invention relates to the field of communication devices and more particular to a locking mechanism for a communication module, and a communication device.

BACKGROUND

Presently, various modules of communication devices are mounted with a wrench to insert and then fixed with captive fastener screws, or directly fixed with captive fastener screws. The mounting will be introduced in detail below referring to figures. Various modules of communication devices include fan modules, power supply modules and filtering modules, etc.

Referring to FIG. 1, shown is a perspective view of a locking mechanism for communication module in prior art.

The communication device 101a includes a plurality of module grooves 102a. During the assembly of a communication module, firstly the communication module 104a is pushed into the module groove 102a of the communication device 101a, and then the communication module 104a is pushed in place using the leverage of wrenches 103a. The position of the communication module 104a is fixed by the interaction between a clamping jaw 105a on the wrench 103a and square holes 106a on the module groove 102a. Finally, captive fastener screws 107a on the wrenches 103a are tightened, and the communication module 104a is fixed at the same time the wrenches 103a are fixed.

During the realizing of the present invention, the inventor discovers that the prior art at least has the following disadvantages: before the communication module 104a is removed, the wrenches 103a prop tightly against the communication module 104a, which causes to space for manual operation is not enough. Besides, as each time captive fastener screws are needed for fixation in the end of the assembly process, the user needs tool for the operation, thus causing low user operability.

Above all, the operability of the locking mechanism for the communication module in the prior art is low.

SUMMARY

An embodiment of the invention provides a locking mechanism for communication module and a communication device, which can be operated simply and has high operability.

An embodiment of the invention provides a locking mechanism for the communication module and a communication device, which includes a module frame, and a handle, a upper-and-lower bolt, a handle stopping mechanism and a handle self-locking mechanism, wherein the handle, the upper-and-lower bolt, the handle stopping mechanism and the handle self-locking mechanism are arranged on the module frame;

the handle is connected with the upper-and-lower bolt through the linkage mechanism of the upper-and-lower bolt, when rotating under the action of a force, the handle is moved with the upper-and-lower bolt through the linkage mechanism, and the communication module is inserted into or pulled out of communication device by the elastic function of the upper-and-lower bolt;

when the communication module is not inserted into the communication equipment, the stopping bolt on the handle stopping mechanism stops the handle and the handle is locked; when the communication module is inserted, the stopping bolt on the handle stopping mechanism separates from and releases the handle;

when the communication module is inserted, the handle is closed, the latch of the handle self-locking mechanism withdraws under the extrusion of a clamping seat on the module frame, the latch clamps the clamping seat, and the handle is self-locked.

The inserting and pulling out of the communication module is realized by the locking mechanism of the communication module provided by above technical solutions, using the linkage of the handle and the upper-and-lower bolt; after the communication module is inserted, the handle is self-locking by the handle self-locking mechanism. The locking mechanism avoids mounting by screws and using any other tool when the communication module is inserted and pulled out, can be operated simply and has high operability. The locking and unlocking of the communication module can be realized by directly applying external force to the handle and using elastic extension and retraction function and linkage functions of the upper-and-lower bolt.

DESCRIPTION OF EMBODIMENTS

Firstly, an embodiment of the invention realizing a locking mechanism for a communication module is described, and the locking mechanism includes a module frame, and a handle, a upper-and-lower bolt, a handle stopping mechanism and a handle self-locking mechanism, wherein the handle, the upper-and-lower bolt, the handle stopping mechanism and the handle self-locking mechanism are arranged on the module frame;

the handle is connected with the upper-and-lower bolt, so that the upper-and-lower bolt can move with the handle when the handle rotates, in order to be inserted or pulled out the communication module;

when the communication module is not inserted, the handle stopping mechanism is used for locking the handle, and when the communication module is inserted into the communication device, the handle stopping mechanism is used for releasing the handle;

when the communication module is inserted, the handle self-locking mechanism is used for locking the handle.

The inserting and pulling out of the communication module is realized by the locking mechanism of the communication module provided by the embodiments, using the linkage of the handle and the upper-and-lower bolt; after the communication module is inserted, the handle is self-locking by the handle self-locking mechanism. The locking mechanism avoids mounting by screws and using any other tool when the communication module is inserted and pulled out, can be operated simply and has high operability. The locking and unlocking of the communication module can be realized by directly applying external force to the handle and using elastic extension and retraction function and linkage functions of the upper-and-lower bolt.

Figure 1:
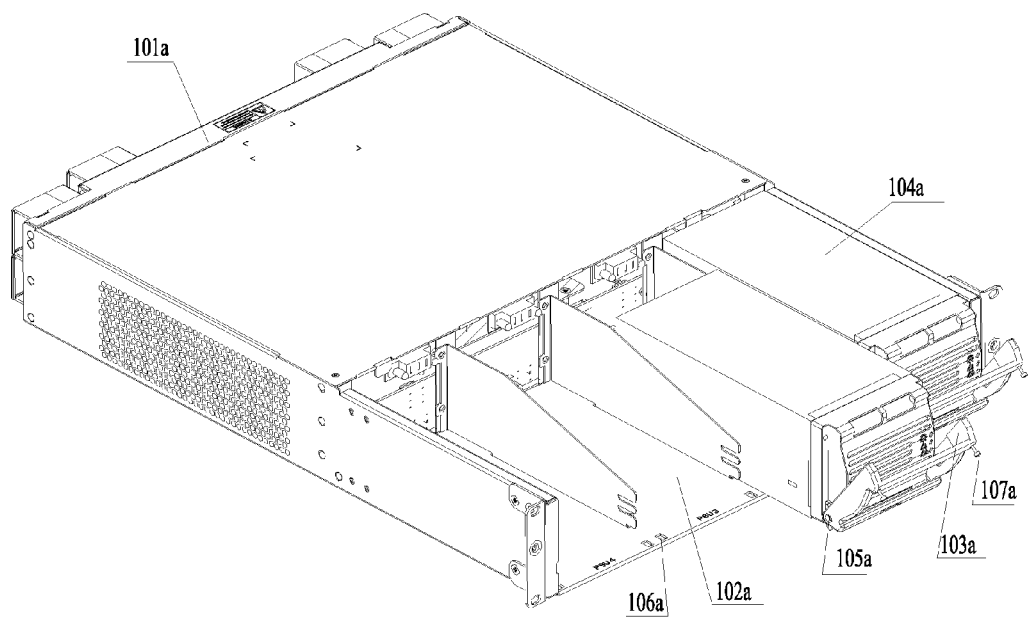
FIG. 1 is a perspective view of the locking mechanism for the communication module of the prior art.
Figure 2:
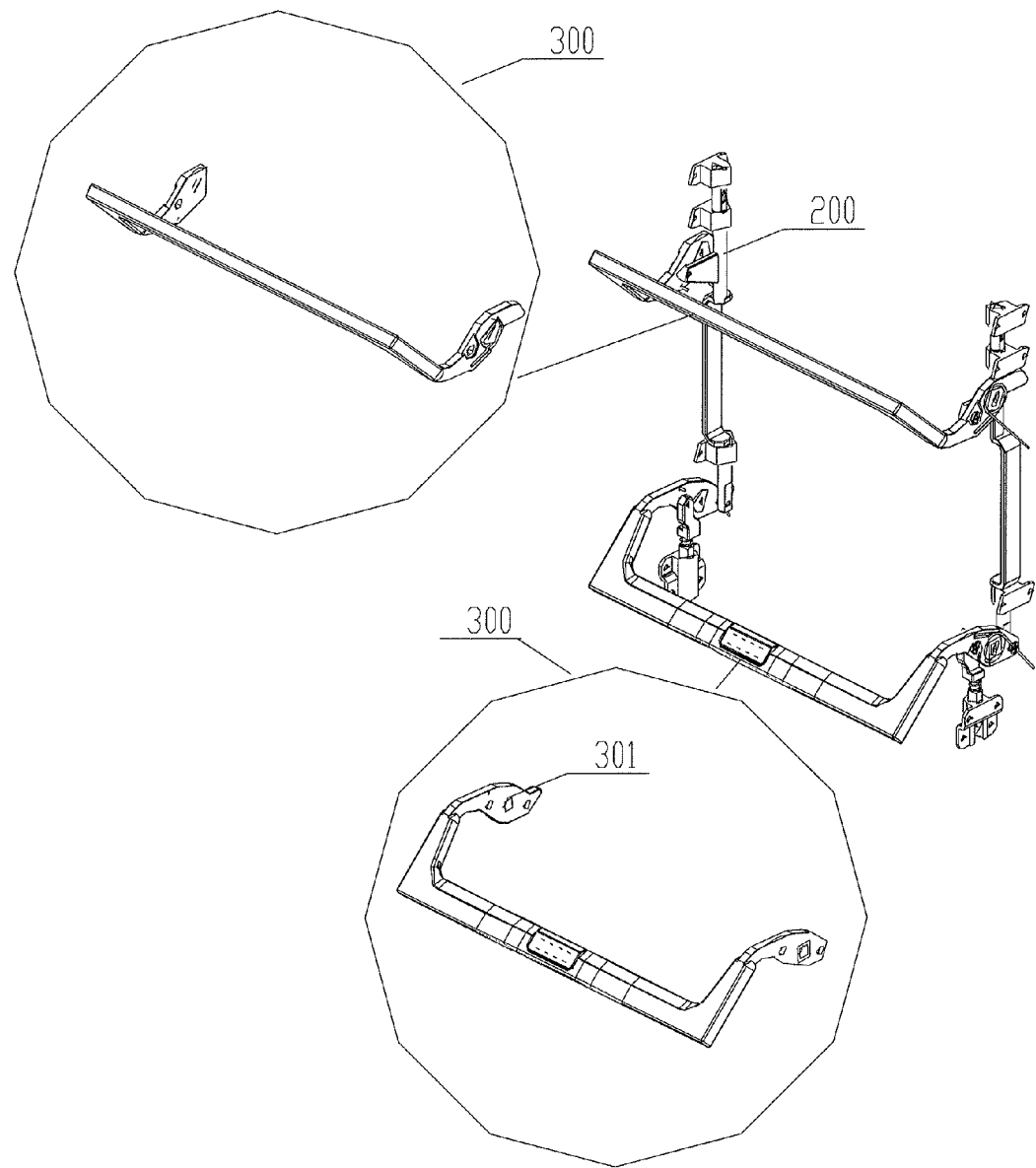
FIG. 2 is a perspective view of the locking mechanism according to the first embodiment of the present invention.
Figure 3:
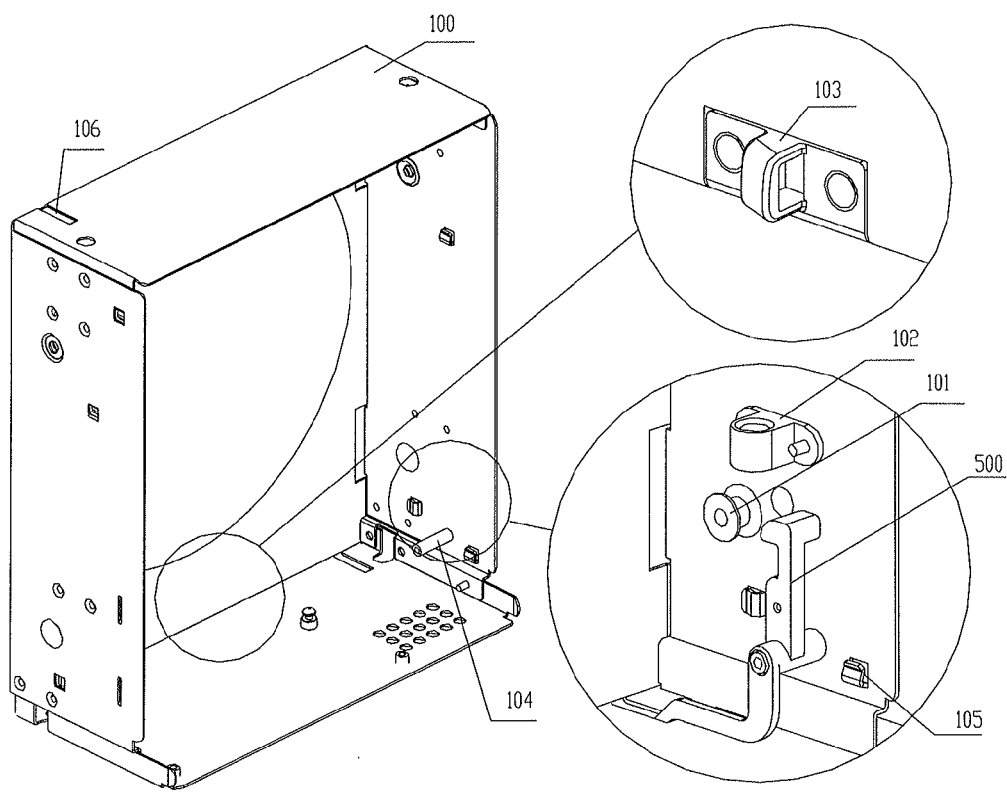
FIG. 3 is a perspective view of the module frame in the locking mechanism according to embodiments of the present invention.

Referring to FIGS. 2 and 3, shown are perspective views of the locking mechanism for the communication module according to the first embodiment of the present invention.

The locking mechanism for the communication module provided in the present embodiment includes a module frame 100, and handles 300, upper-and-lower bolts 200, handle stopping mechanisms 400 and handle self-locking mechanisms 500, wherein the handles 300, the upper-and-lower bolts 200, the handle stopping mechanism 400 and the handle self-locking mechanism 500 are arranged on the module frame 100;

The handles 300 are connected with the upper-and-lower bolts 200, so that the upper-and-lower bolts 200 can move with the handles 300 when the handles 300 rotate, in order to insert or pull out the communication module;

When communication module is not inserted, the handle stopping mechanism 400 is used for locking the handles 300, and when the communication module is inserted, the handle stopping mechanism 400 is used for releasing the handles 300;

When the communication module is inserted, the handle self-locking mechanism 500 is used for locking the handles 300.

Firstly, the structure of handles 300 will be introduced.

The handles 300 have U-typed structure, one shaft hole 301 is mounted at each end of a handle 300, and the two shaft holes 301 are concentrically arranged;

The module frame is provided with handle shafts, and shaft holes 301 on a handle are cooperated with handle shafts on the module frame so as to rotate the handle.

Secondly, the module frame 100 will be introduced.

As the locking mechanism supporting part, the module frame 100 is directly or indirectly mounted with all the components thereon. Handle shafts 101 are fixed in the inner wall of the module frame 100 by means of risen riveting, and guide sleeves 102 and clamping seats 103 are pulled by rivets in the inner wall of the module frame 100, the stud 104 pressed by the rivets in the inner wall of the module frame 100 is used for shafting of the handle stopping mechanism 400. Clamping hook 105 in the inner wall of module frame 100 is used to block the first spring, and square hole 106 is used to avoid the tail of the handle stopping mechanism 400, so that it can extend outside of the module frame.

One upper-and-lower bolt 200 is mounted in one of the left and right inner side surfaces in the frame, respectively, each includes an upper bolt and a lower bolt, wherein the upper handle is connected with two upper bolts, and the lower handle is connected with two lower blots.

Figure 4:
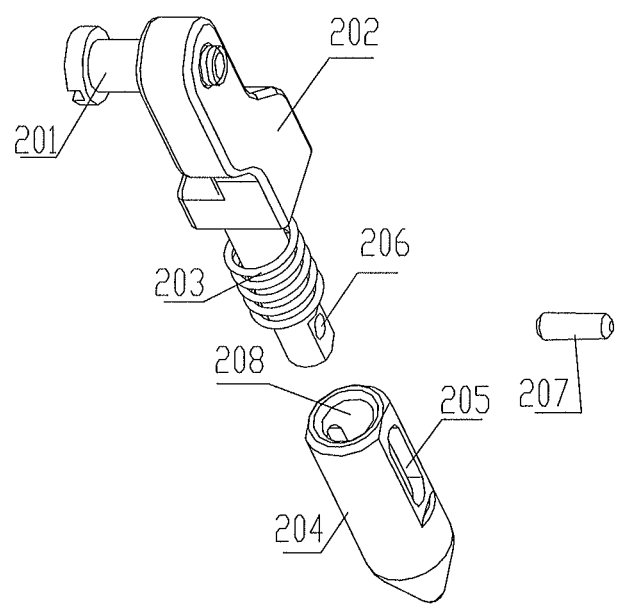
FIG. 4 is a perspective view of the elastic taper bolt according to the present invention.

The specific structure of the upper-and-lower bolts is introduced with figures below. Now referring to FIG. 4, shown is a perspective view of the elastic taper bolt.

A upper-and-lower bolt includes an elastic taper bolt and a linkage mechanism;

The elastic taper bolt includes a taper bolt 204, a slider bar bolt 202, a first spring 203 and a bolt pin 207;

The slider bar bolt 202 is inserted into a shaft hole 208 of the taper bolt 204 through the first spring 203, the bolt pin 207 is riveted in rivet hole 206 at the tail of the slider bar bolt 202 through the slide groove 205 of the taper bolt 204;

The bolt shaft 201 is screwed into a screwed hole of the elastic taper bolt through the obround hole in the handles, so that the elastic taper bolt axially moves along the guide sleeve 102 on the module frame when the handle is rotated.

Figure 5:
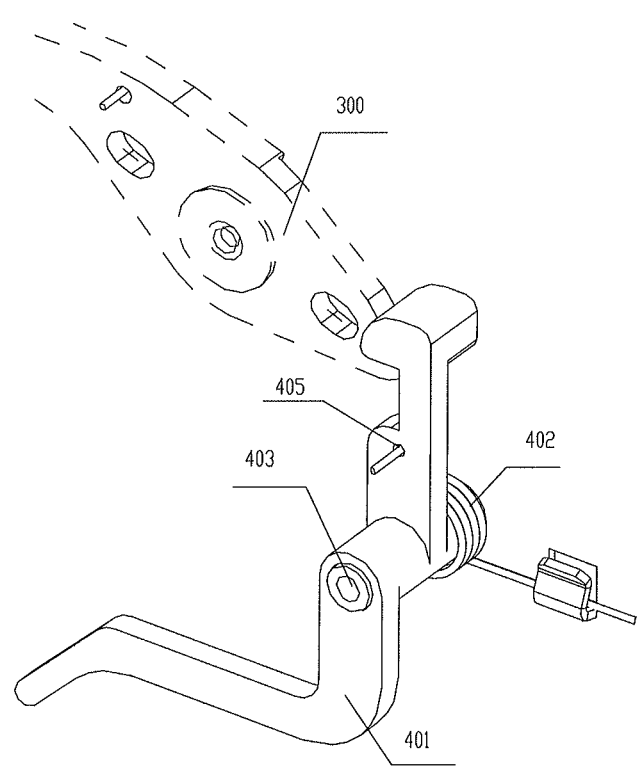
FIG. 5 is a perspective view of the handle stopping mechanism of the present invention.

The handle stopping mechanism 400 is introduced below. Referring to FIG. 5, shown is a perspective view of the handle stopping mechanism.

The handle stopping mechanism 400 includes a stopping bolt 401, a first spring 402, a shaft 403 and a screw;

the shaft 403 is pressed by the rivets on the stud of the module frame, the shaft 403 passes through a shaft hole in the stopping bolt 401 so that the stopping bolt 401 is rotated around the shaft 403, the screw (not shown in the figure) is used for preventing the stopping bolt 401 from disengaged off;

one end of the first spring 402 is fixed in a circular hole 405 of the stopping bolt 401, and the other end is clamped in the clamping hook on the module frame.

Figure 6:
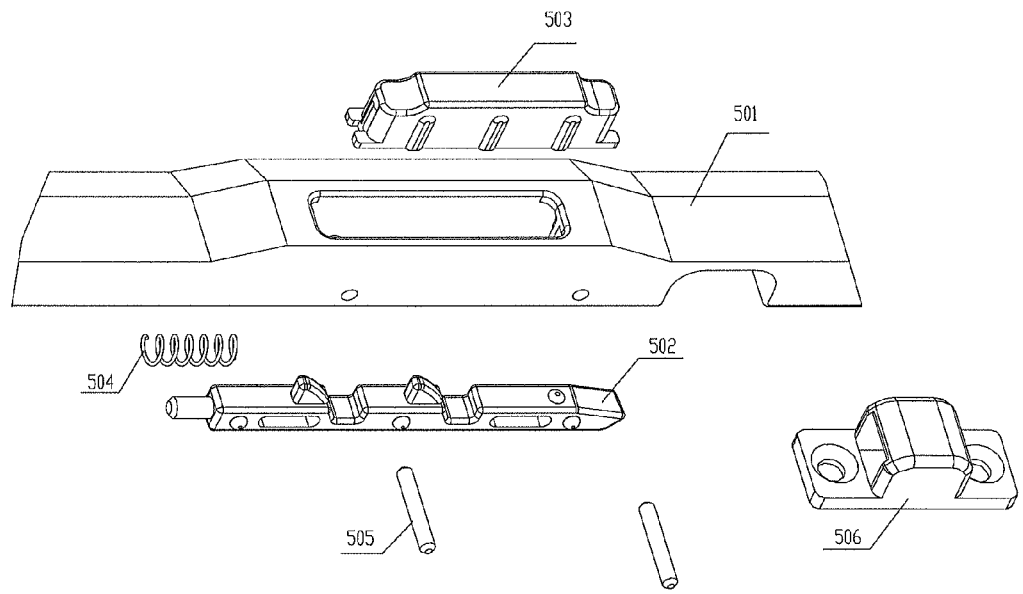
FIG. 6 is a perspective view of the handle self-locking mechanism of the present invention.

The handle self-locking mechanism 500 is introduced below. Referring to FIG. 6, shown is a perspective view of the handle self-locking mechanism.

The handle self-locking mechanism 500 includes a main body 501, a latch 502, a button 503, a second spring 504, a bolt pin 505 and a clamping seat 506;

The main body 501 is provided with a mounting groove 501a. The button 503 is sheathed into the mounting groove 501a. The second spring 504 is sheathed on the latch 502, wherein the latch 502 is pressed into the mounting groove 501a and contacts with the button 503 at the arc curved surface. The bolt pin 505 is inserted into holes of the main body 501 and the latch 502, so that the latch 502 is fixed on the main body 501.

The clamping seat 506 is fixed by rivets in the module frame.

Figure 7:
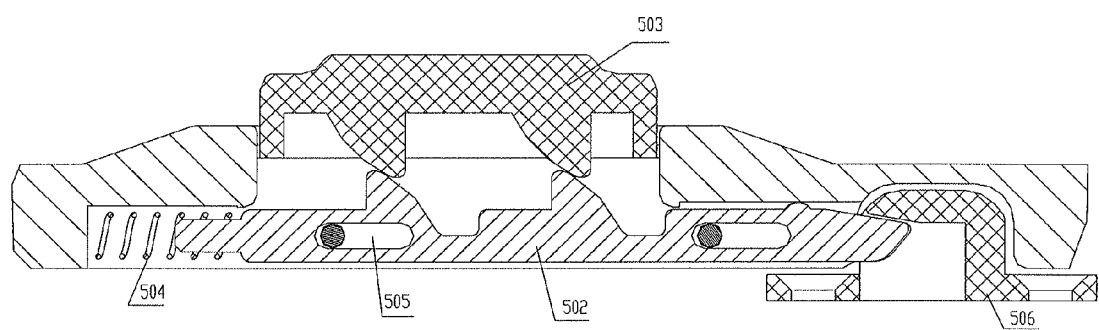
FIG. 7 is a section view of the handle self-locking mechanism of the present invention.

In order to better understand the interaction of the handles and the handle self-locking mechanism to those of skills in the art, the following shall be introduced in detail in combination with FIG. 7. Referring to FIG. 7, shown is a section view of the handle self-locking mechanism.

The operating principle of the handle self-locking mechanism is converting vertical movement of the button 503 to horizontal movement of the latch 502 by the cooperation of the arc surfaces on the latch 502 and the button 503.

The handle is provided with an opening for the button 503 sliding in parallel. The button 503 is assembled into the opening, maintaining movement degree of freedom in one direction.

The handle is provided with an opening for the latch 502 sliding in parallel. The latch 502 is assembled into the opening, maintaining movement degree of freedom in one direction.

Two slot-type holes are provided in the mid-region of the latch 502 and two circular bolt pin holes are provided in the handles. The bolt pin 505 is riveted in the circular bolt pin hole of the handle through slot-type hole of the latch 502. The latch 502 is retained the translational degrees of freedom of a fixed stroke in the limited range of the bolt pin 505.

A cylindrical convex platform is provided in the tail of the latch 502. One end of the second spring 504 is sheathed in the convex platform, and the other end is placed against the side wall of the handle opening, so that the latch 502 can be elastically extended and retracted.

The head of the latch 502 is designed to provide with an arc surface. The arc surface of head of the latch 502 is compressed to retract by the clamping seat 506 when the handle is closed. The miter compression of the latch 502 is removed after the handle has been closed completely, and the latch 502 is reset by the second spring 504. Then, the clamping seat 506 is clamped by the latch 502, and the handles are self-locked.

The button 503 is provided with two arc-shaped convexities to cooperate the arc surface of the latch 502 for compressing each other. The latch 502 is retracted under the compression of arc-shaped convexities when the button 503 is pressed, and the self-locking state of the handles is released.

The specific structure of the components of the locking mechanism provided in the embodiment of the present invention is introduced, respectively, in combination with figures above. The connection between the handle, the upper-and-lower bolt, the handle stopping mechanism and the handle self-locking mechanism will be introduced in detail in combination with the lateral view of the locking mechanism below.

Figure 8:
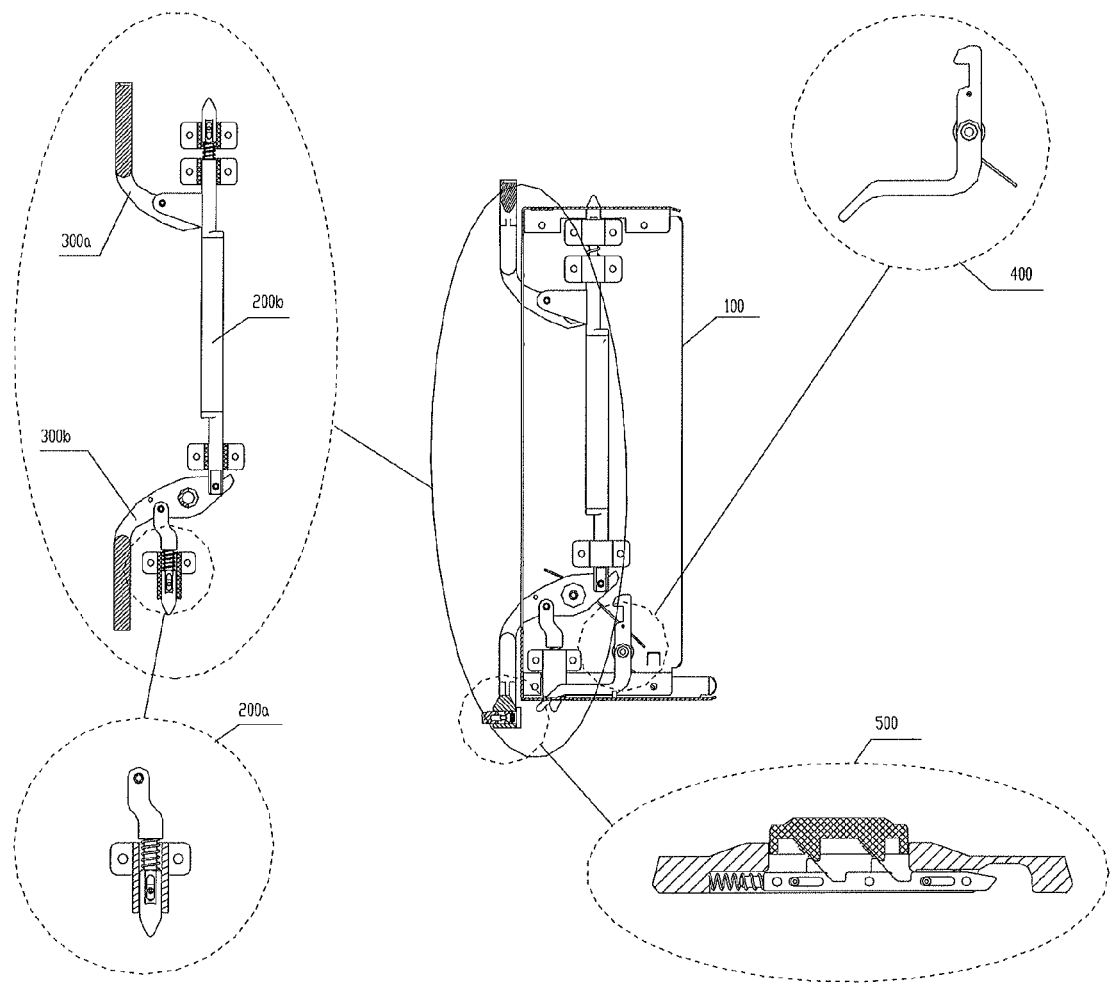
FIG. 8 is a lateral view of the locking mechanism according to the first embodiment according to the present invention.

Referring to FIG. 8, shown is a lateral view of the locking mechanism according to the present invention.

The handle provided in the embodiment includes an upper handle 300a and a lower handle 300b. Wherein, the upper handle 300a is connected with the upper elastic taper bolt of the upper-and-lower bolt, the lower handle 300b is connected with the lower elastic taper bolt of the upper-and-lower bolt. In order to make the structure of each component clearer, the figure shows partial enlargement views of several components.

The upper-and-lower bolt includes an elastic taper bolt 200a and a linkage mechanism 200b. The linkage mechanism is connected with the upper elastic taper bolt and the lower elastic taper bolt.

As the figure is a lateral view of the locking mechanism, only one side of the module frame 100 can be seen.

As the structures of the left and right sides of the module frame 100 are the same, the figure only shows the structure of one side inside the module frame 100. As the structure of the other side is the same, the description is omitted here.

The operating principle of the locking mechanism provided in the present embodiment will be introduced in detail in combination with the figures below.

Firstly, the operating process of the locking mechanism during the inserting of the communication module into the communication device is introduced.

Figure 9:
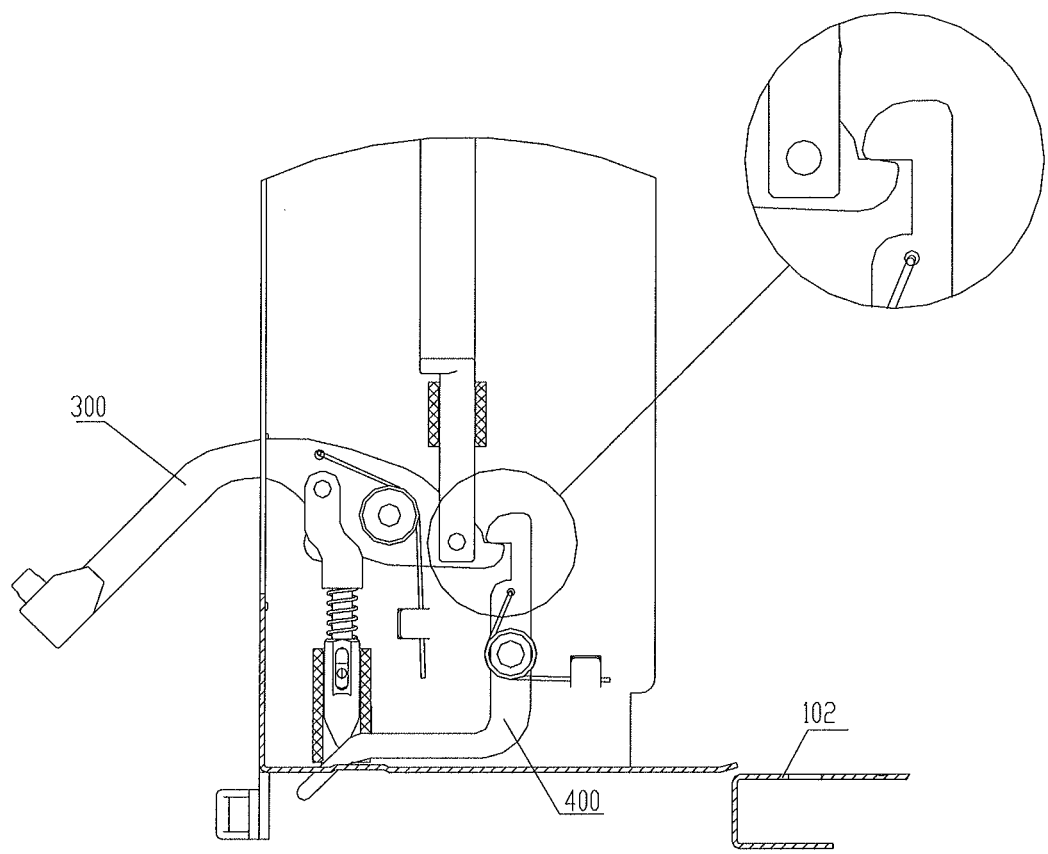
FIG. 9 is a lateral view of the locking mechanism of the present invention before the communication module is inserted.

Referring to FIG. 9, shown is a lateral view of the locking mechanism of the present invention before the communication module is inserted.

The handle 300 is expanded to a limit position before the communication module is inserted into the grooves 102 of the communication device. In the embodiment, the limit position is designed as the angle between the rail of the handles 300 and the communication module is 45 degrees. At the same time, the handle 300 is locked by the handle stopping mechanism 400, making the handle in a rigid state; and thus, as an component which assists in applying force to the whole communication module, the handle 300 is directly applied an external force, and the communication module is pushed into the groove 102 gradually.

Figure 10:
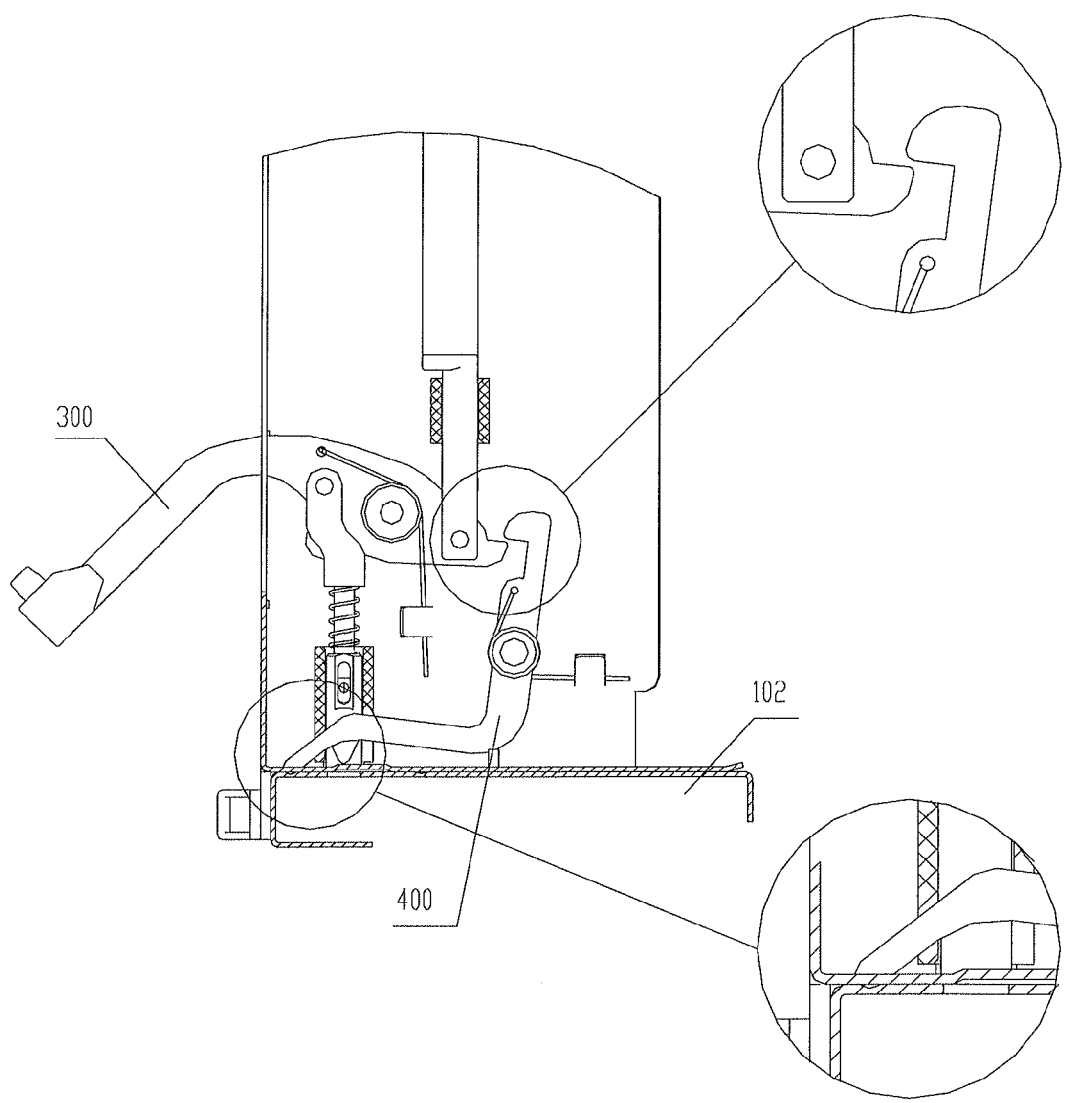
FIG. 10 is a lateral view of the locking mechanism of the present invention after the communication module is inserted.

Referring to FIG. 10, shown is a lateral view of the locking mechanism of the present invention after the communication module is inserted.

When the communication module is pushed in place, the handle stopping mechanisms 400 are contacted by the slide of the grooves 102, the handle stopping mechanisms 400 are loosen, the handle 300 is unlocked, and the handle 300 return to the rotatable state.

Figure 11:
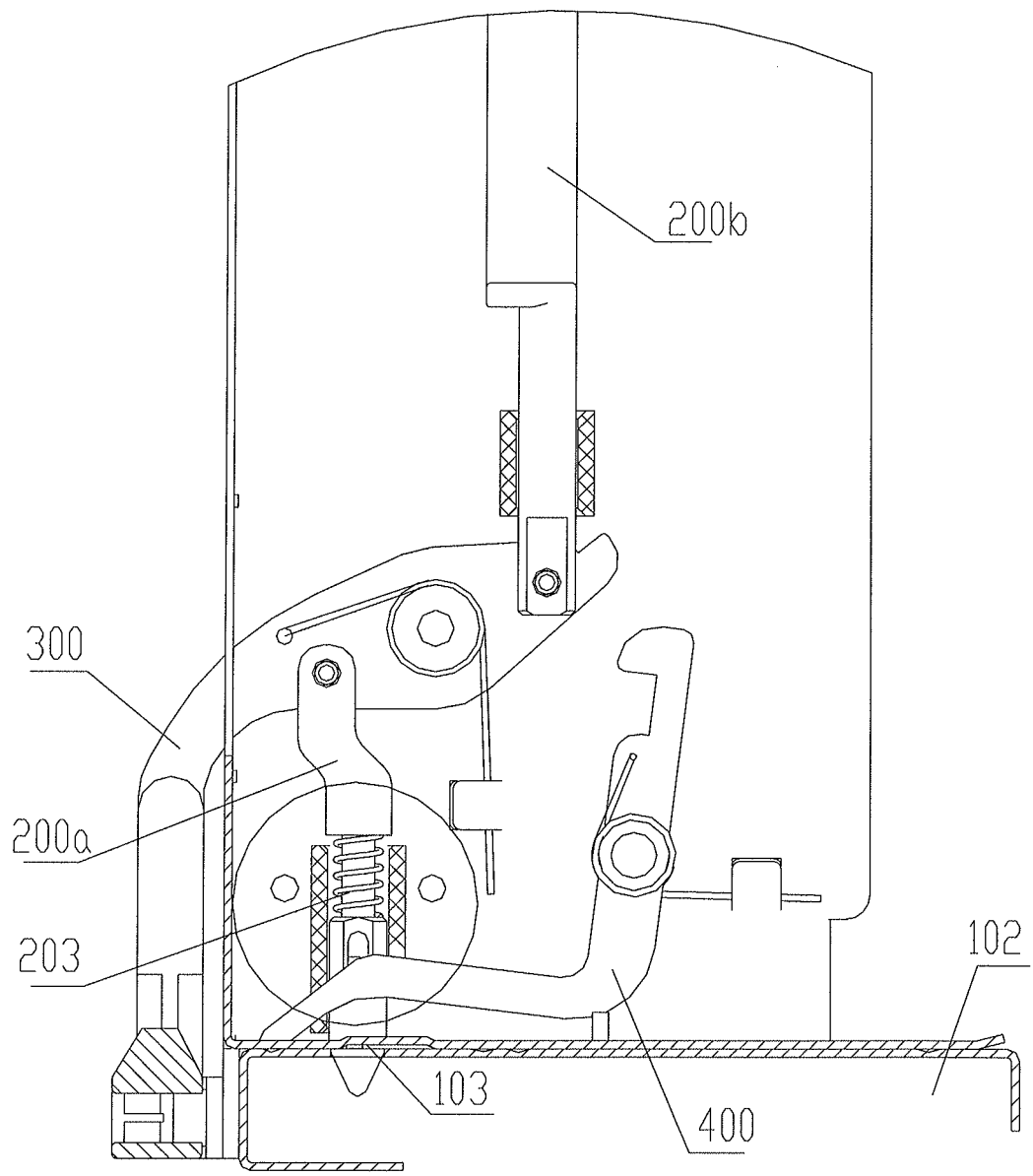
FIG. 11 is a lateral view of the locking mechanism, after the communication module of the present invention is inserted and with the handles self-locked.

Referring to FIG. 11, shown is a lateral view of the locking mechanism with the handle self-locked after the communication module of the present invention is inserted.

As the handle 300 is in rotatable state, at the same time, the handle 300 is rotated, driving the internal linkage mechanism 200b to move, and the elastic taper bolt 200a is pushed out gradually, until the taper-shaped surface of the elastic taper bolt 200a is placed against the circular hole 103 in the slideway.

The handle 300 is continuously rotated, the link mechanism 200b continuously moves. At the same time, as the taper-shaped surface of the elastic taper bolt 200a is placed against the circular hole 103 in the slideway, the first spring 203 on the elastic taper bolt 200a is compressed, the tail of the elastic taper bolt 200a is pressed firmly against the circular holes 103 in the slide by the spring force generated by the compressed first spring 203, and the handle 300 is self-locked by the self-locking mechanisms 500 after being rotated in place, now the angle between the rail of the handle 300 and the communication module is 0 degrees.

The inserting of the communication module into the communication device is introduced in detail in combination with figures above. Since the pulling out of the communication module from the communication device is opposite to the inserting of the communication module into the communication device, the pulling out of the communication module from the communication device will be introduced in brief below.

Figure 12:
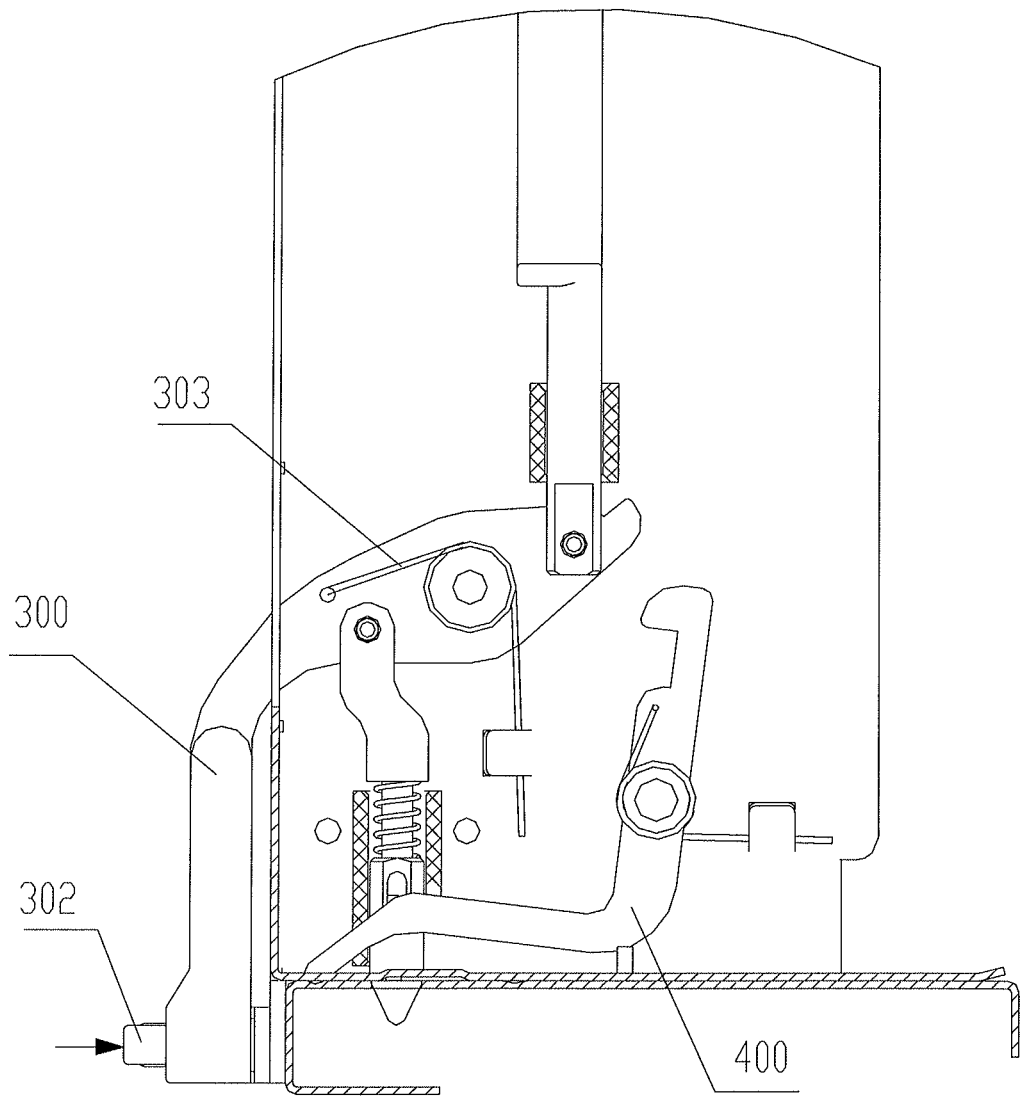
FIG. 12 is a perspective view of the communication module of the present invention after being pulled out.

Referring to FIG. 12, shown is a perspective view of the communication module being pulled out.

Firstly, the button 302 on the handle 300 is pressed, and the handle is unlocked. At the same time, the handle 300 is in a rotatable state. The handle 300 is bounced off by the spring force generated by the spring 303 on the handle. After the communication module is pulled out by applying the external force on the handle 300, the handle 300 is self-locked by the handle stopping mechanism 400.

The upper-and-lower bolts of the locking mechanism for the communication module provided in the above embodiment is designed to adopt spring for making the elastic taper bolt with an elastic extension and retraction function. The upper-and-lower bolts provided in a second embodiment is designed to realize the elastic extension and retraction function of the upper-and-lower bolt using a elastic mechanism of the shaft part. The embodiments will be introduced in detail in combination with figures below.

Figure 13:
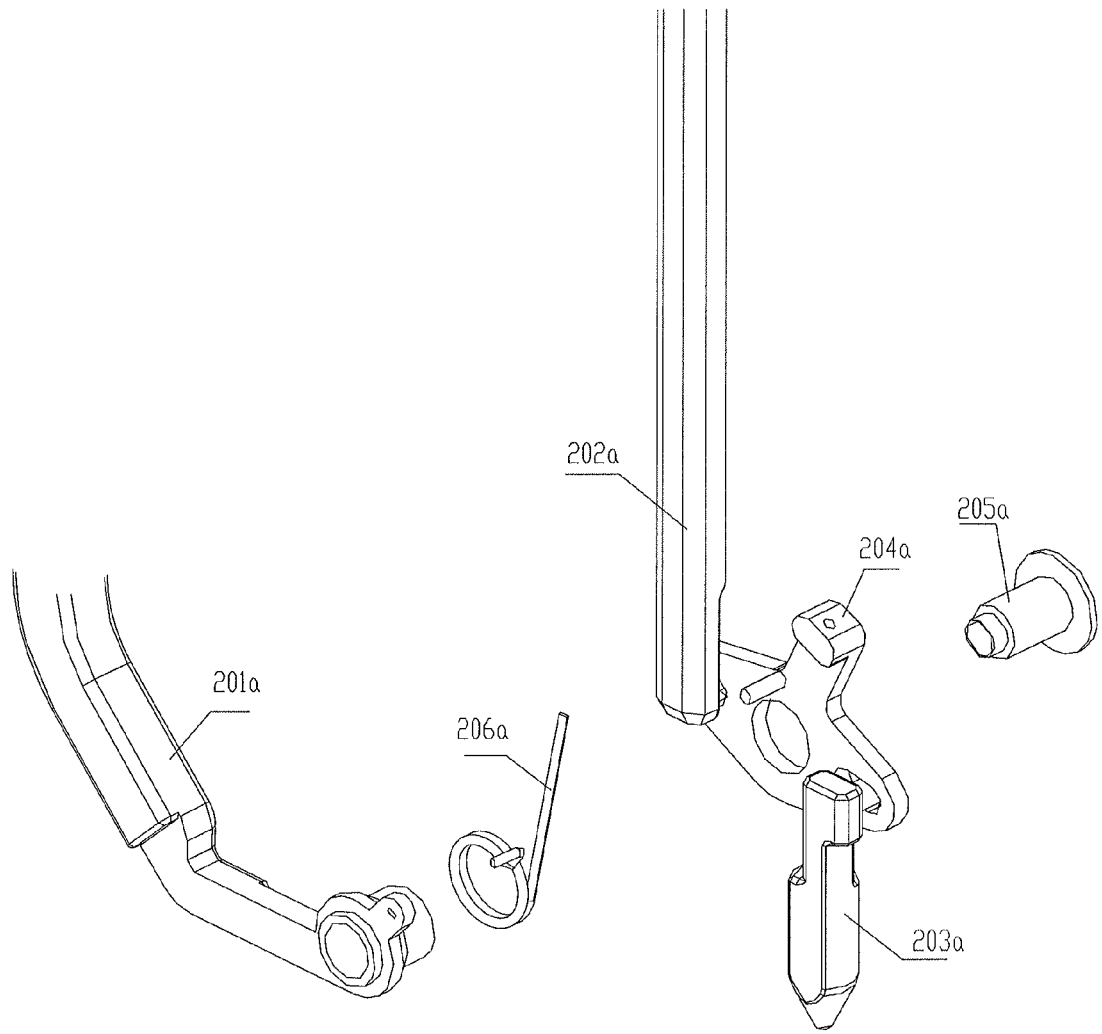
FIG. 13 is a perspective view of the elastic taper bolt according to the second embodiment of the present invention.

Referring to FIG. 13, shown is a perspective view of the upper-and-lower bolt according to the second embodiment of the present invention;

The upper-and-lower bolt provided in the present embodiment includes an upper taper bolt 202a, a lower taper bolt 203a, a driven wheel 204a, a second shaft 205a and a second spring 206a.

The second shaft 205a is riveted by risen riveting into the circular hole in the module frame 100 through the shaft hole of the driven wheel 204a, the second spring 206a, and the shaft hole of the handle 201a.

The handle 201a can rotate around the second shaft 205a, and the driven wheel 204a can rotate around the handle 201a. One end of the second spring 206a is fixed through the circular hole on the handle 201a, and the other end is fixed through the circular hole on the driven wheel 204a.

Figure 14:
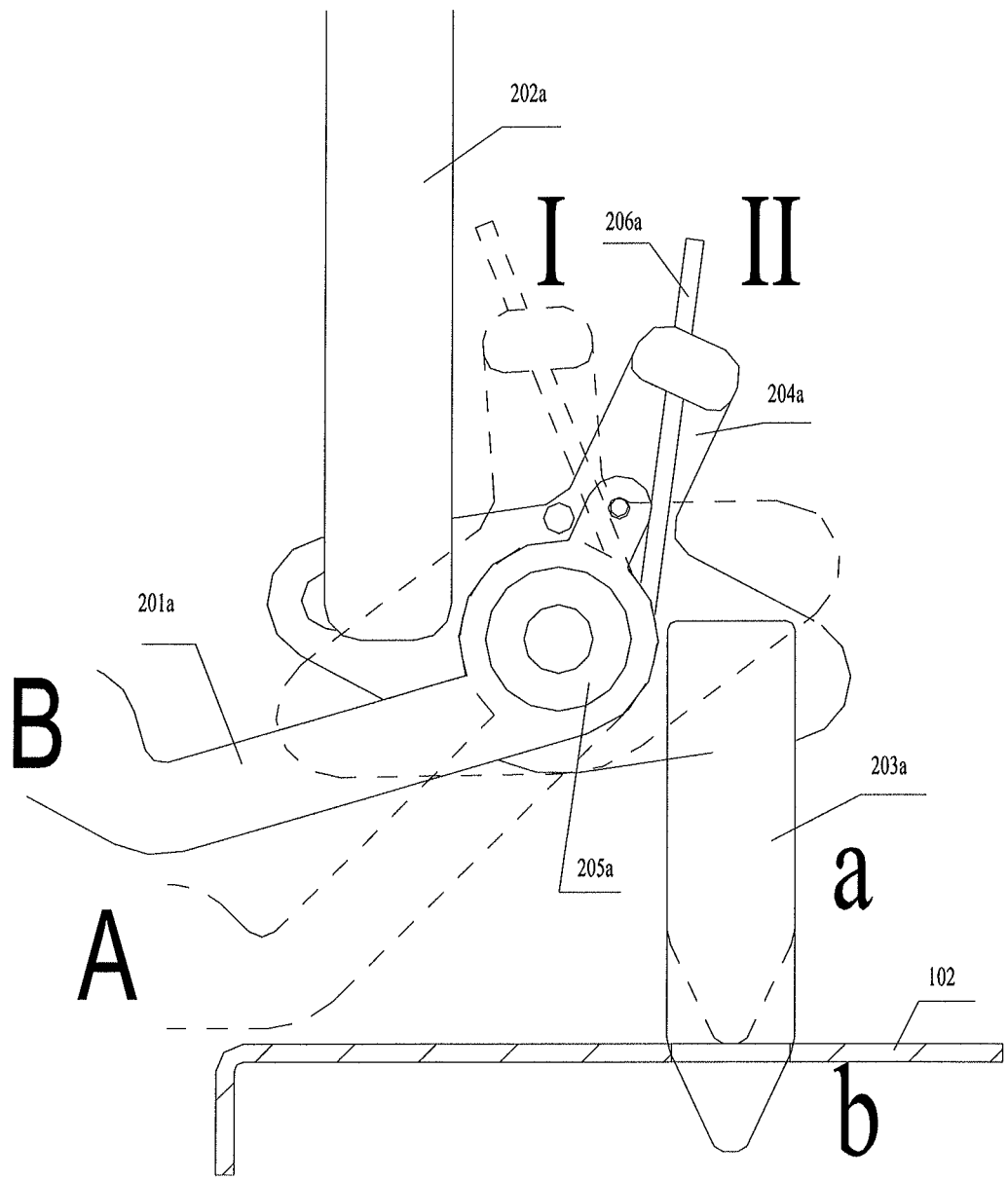
FIG. 14 is a working principle diagram of the locking mechanism according to the second embodiment of the present invention.

The operating principle of the locking mechanism provided in the present embodiment will be introduced in detail in combination with FIG. 14 below.

The extension and retraction movement of the taper bolt is realized by the upper-and-lower bolt provided in the present embodiment using the driven wheel 204a driven by the handle 201a. The second spring 206a between the handle 201a and the driven wheel 204a provides the elastic extension and retraction function for taper bolt.

When the handle 201a is closed, the driven wheel 204a is driven to rotate by the handle 201a through the second spring 206a; and the upper taper bolt 202a and the lower taper bolt 203a are driven to move axially by the driven wheel 204a. The taper-typed tail of the lower taper bolt 203a is driven by the driven wheel 204a to prop against the circular hole 103 in the slide of the groove of the communication device; at the same time, the handle 201a is moved from position A to position B, the driven wheel 204a is moved from position I to position II, the tail of the lower taper bolt 203a is moved from position a to position b. As the handle 201a continuously closes, the driven wheel 204a and the taper bolt stay still, the driven wheel 204a stays in position II, the lower taper bolt 203a stays in position b, the second spring 206a between the handle 201a and the driven wheel 204a is twisted, and the elastic force generated is transferred to the taper bolt, making the tail of the taper bolt pressed firmly into the circular holes 103 in the slide of the groove of the communication device, and the handle 201a is self-locked using the handle self-locking mechanism.

When the handle 201a is loosen, the handle 201a is self-unlocked, the handle 201a is released by the second spring 206a of the handle 201a, the driven wheel 204a is driven by the limit structure on the handle 201a, and the taper bolt 203a is retracted axially and disengaged from the circular hole 103 in the slide of the groove of the communication device.

Figure 15:
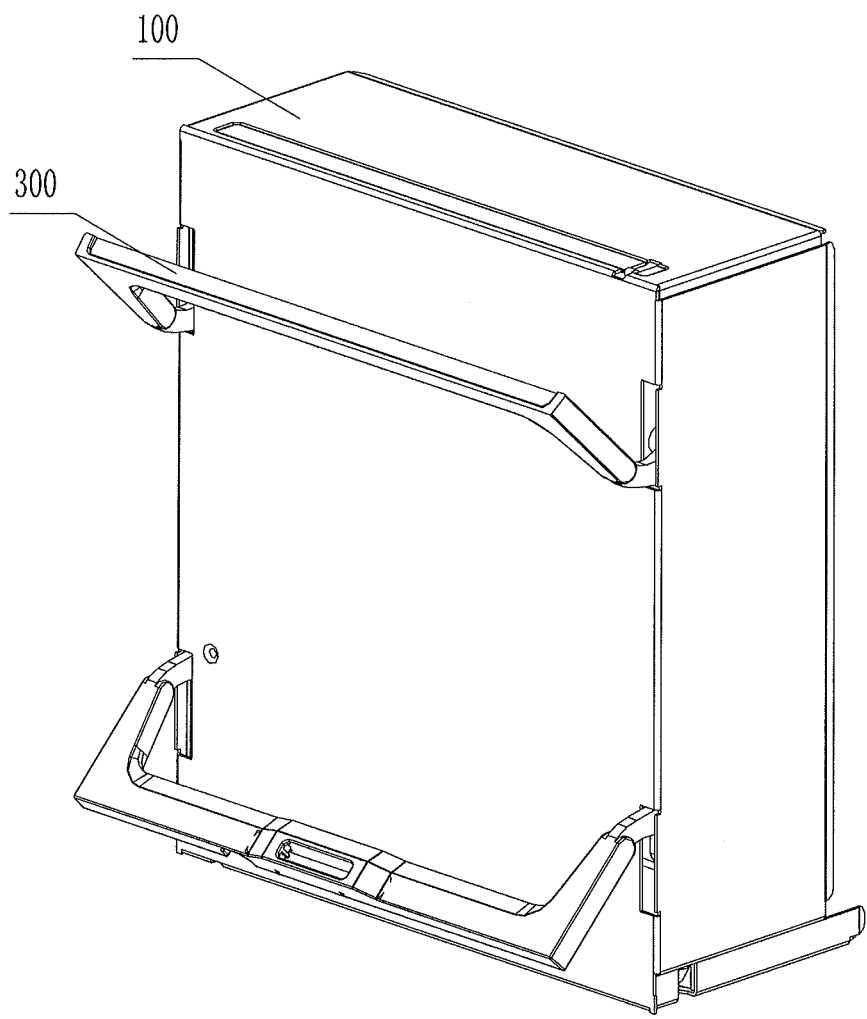
FIG. 15 is an external perspective view of the locking mechanism according to the first embodiment of the present invention.

In order to better understand and implement the present invention to those skills in the art, the locking mechanism will be intuitively introduced as a whole below. Referring to FIG. 15, shown is an external perspective view of the locking mechanism according to the embodiment of the present invention. FIG. 15 shows an external perspective view of the locking mechanism of the two handles according to the first embodiment. It can be seen from FIG. 15, the rails of the two handles 300 are located outside the module frame 100, and the communication module can be conveniently inserted into or pulled out from the grooves of the communication device by the external force applied on those handles.

An embodiment of the invention also provides a communication device, which includes a locking mechanism and a communication module in the above embodiments, wherein the locking mechanism is used to realize the locking and unlocking of the communication module in the communication device.

The above descriptions are merely exemplary embodiments of the present invention, but not intended to limit the present invention in any form. Although the present invention has been disclosed as the preferred embodiments, those embodiments do not intended to limit the present invention. Many alterations and modifications, or modified to equivalents of the embodiments can be made by those of skills in the art who can utilize those disclosed methods and the technical contents, without departing from the scope of the technical solutions of the present invention. Therefore, any modification, variation, or replacement made without departing from the spirit and principle of the present invention should fall within the scope of the present invention. Therefore, the protection scope of the present invention is subject to the appended claims.

What is claimed is:

1. A locking mechanism for a communication module, the locking mechanism comprising: a module frame, a handle, a upper-and-lower bolt, a handle stopping mechanism and a handle self-locking mechanism, wherein the handle, the upper-and-lower bolt, the handle stopping mechanism and the handle self-locking mechanism are arranged on the module frame;
    wherein the handle is connected with the upper-and-lower bolt through a linkage mechanism of the upper-and-lower bolt; when rotating under the action of a force, the handle is moved with the upper-and-lower bolt through the linkage mechanism, and the communication module is inserted into or pulled out of communication device by an elastic function of the upper-and-lower bolt;
    wherein when the communication module is not inserted into the communication equipment, a stopping bolt on the handle stopping mechanism stops the handle and the handle is locked; when the communication module is inserted, the stopping bolt on the handle stopping mechanism separates from and releases the handle; and
    wherein when the communication module is inserted, the handle is closed, a bolt of the handle self-locking mechanism withdraws under the extrusion of a clamping seat on the module frame, the bolt clamps the clamping seat, and the handle is locked.

2. The locking mechanism for the communication module according to claim 1, further comprising two-handles and two-upper-and-lower bolts.

3. The locking mechanism for the communication module according to claim 2, wherein said handle has a U-shaped structure, one shaft hole is provided in each end of the handle, and the two shaft hole are concentrically arranged; and
    a handle shaft is provided on the module frame, the shaft holes on the handle are cooperated with the handle shaft on the module frame so as to make the handle rotate.

4. The locking mechanism for the communication module according to claim 3, wherein said upper-and-lower bolts include an elastic taper bolt and a linkage mechanism;
   the elastic taper bolt includes a taper bolt, a slider bar bolt, a first spring and a bolt pin;
   the slider bar bolt is inserted into a shaft hole of the taper bolt through the first spring, the bolt pin is riveted into a rivet hole in the tail of the slider bar bolt through a slide groove of the taper bolt; and
   a bolt shaft is screwed to a screwed hole of the elastic taper bolt through an obround hole of the handles, so that the elastic taper bolt axially moves along a guide sleeve on the module frame when the handle is rotated.

5. The locking mechanism for the communication module according to claim 1, wherein the handle stopping mechanism includes the stopping bolt, a first spring, a shaft and a screw;
   the shaft is pressed by the rivets on the stud of the module frame, and the shaft passes through a shaft hole in the stopping bolt, so that the stopping bolt is rotated around the shaft, the screw is used for preventing the stopping bolt from falling off; and
   one end of the first spring is fixed in a circular holes of the stopping bolt, and the other end is clamped in the clamping hook on the module frame.

6. The locking mechanism for the communication module according to claim 1, wherein the handle self-locking mechanism includes a main body, a latch, a button, a second spring, a bolt pin and a clamping seat; and
   the main body is provided with an mounting groove, the button is sheathed in the mounting groove, the second spring is sheathed on the latch, wherein the latch is pressed into the mounting groove and contacted with the button via a arc curved surface, the bolt pin is inserted into holes of the main body and the latch, so that the latch is fixed onto the main body.

7. The locking mechanism for the communication module according to claim 1, comprising a single handle, and a single upper-and-lower bolt wherein the upper-and-lower bolt includes an upper taper bolt, a lower taper bolt, a driven wheel, a second shaft and a second spring;
   the second shaft is riveted by risen riveting in a circular hole of the module frame through a shaft hole of the driven wheel, the second spring, a shaft hole of the handle, so that the handle rotates around the second shaft, the driven wheel rotates around the handle; and
   the end of the second spring is fixed through a circular hole on the handle, and the other end is fixed through a circular hole on the driven wheel.

8. A communication device comprising a communication module, and said locking mechanism according to claim 1, said locking mechanism is used to lock and unlock the communication module.

* * * * *